United States Patent
Gates, Jr. et al.

(10) Patent No.: US 8,221,838 B2
(45) Date of Patent: Jul. 17, 2012

(54) METHOD OF MAKING A CVD COATING SCHEME INCLUDING ALUMINA AND/OR TITANIUM-CONTAINING MATERIALS

(75) Inventors: Alfred S. Gates, Jr., Greensburg, PA (US); Charles G. McNerny, Greensburg, PA (US); Pankaj K. Mehrotra, Greensburg, PA (US); Peter R. Leicht, Latrobe, PA (US)

(73) Assignee: Kennametal Inc., Latrobe, PA (US)

( * ) Notice: Subject to any disclaimer, the term of this patent is extended or adjusted under 35 U.S.C. 154(b) by 506 days.

(21) Appl. No.: 12/137,633

(22) Filed: Jun. 12, 2008

(65) Prior Publication Data

US 2008/0260947 A1    Oct. 23, 2008

Related U.S. Application Data

(62) Division of application No. 11/472,921, filed on Jun. 22, 2006.

(51) Int. Cl.
*B05D 1/36* (2006.01)
*C23C 16/00* (2006.01)

(52) U.S. Cl. ....... 427/255.391; 427/255.32; 427/255.36; 427/255.7; 427/402; 427/419.3

(58) Field of Classification Search ............... 427/248.1, 427/255.28, 255.391
See application file for complete search history.

(56) References Cited

U.S. PATENT DOCUMENTS

| | | | |
|---|---|---|---|
| 4,028,142 A | 6/1977 | Bitzer et al. | |
| 4,196,233 A | 4/1980 | Bitzer et al. | |
| 4,714,660 A | 12/1987 | Gates, Jr. | |
| 4,842,710 A | 6/1989 | Freller et al. | |
| 4,984,940 A * | 1/1991 | Bryant et al. | 407/119 |
| 5,164,051 A | 11/1992 | Komaki et al. | |
| 5,330,853 A | 7/1994 | Hofmann et al. | |
| 5,380,408 A | 1/1995 | Svensson | |
| 5,436,071 A | 7/1995 | Odani et al. | |
| 5,545,490 A | 8/1996 | Oshika | |
| 5,547,767 A | 8/1996 | Paidassi et al. | |
| 5,648,119 A | 7/1997 | Grab et al. | |

(Continued)

FOREIGN PATENT DOCUMENTS

EP    00448720 A1    10/1991

(Continued)

OTHER PUBLICATIONS

Notification of Transmittal of the International Search Report and the Written Opinion of PCT/US 07/13773, filed Jun. 22, 2007, mailed Nov. 29, 2007 (2 pages).

(Continued)

*Primary Examiner* — David Turocy
(74) *Attorney, Agent, or Firm* — Matthew W. Gordon, Esq.

(57) ABSTRACT

A method of making a coated body wherein the method includes the following sequential steps. First, providing a substrate Second, applying by chemical vapor deposition a titanium carbonitride coating layer that has a thickness equal to between about 0.5 micrometers and about 25 micrometers Third, applying by chemical vapor deposition a first titanium/aluminum-containing coating layer that has a thickness between a greater than zero micrometers and about 5 micrometers. Fourth, applying by chemical vapor deposition an alumina coating layer that has a thickness between greater than zero micrometers and about 5 micrometers. The first titanium-containing coating layer and the alumina coating layer makes up a coating sequence, and the method includes applying a plurality of the coating sequences by CVD.

9 Claims, 7 Drawing Sheets

U.S. PATENT DOCUMENTS

| | | | |
|---|---|---|---|
| 5,654,035 A | 8/1997 | Ljungberg et al. | |
| 5,700,551 A | 12/1997 | Kukino et al. | |
| 5,700,569 A | 12/1997 | Ruppi | |
| 5,879,823 A | 3/1999 | Prizzi et al. | |
| 5,915,162 A | 6/1999 | Uchino et al. | |
| 5,920,760 A | 7/1999 | Yoshimura et al. | |
| 6,110,240 A | 8/2000 | Saguchi et al. | |
| 6,254,984 B1 | 7/2001 | Iyori | |
| 6,284,356 B1 | 9/2001 | Kiriyama | |
| 6,333,099 B1 * | 12/2001 | Strondl et al. | 428/216 |
| 6,333,100 B1 | 12/2001 | Palmqvist et al. | |
| 6,436,519 B2 * | 8/2002 | Holzschuh | 428/216 |
| 6,472,060 B1 | 10/2002 | Ruppi et al. | |
| 6,689,450 B2 | 2/2004 | Ruppi | |
| 6,726,987 B2 | 4/2004 | Kathrein et al. | |
| 7,153,562 B2 | 12/2006 | Rodmar et al. | |
| 7,163,735 B2 | 1/2007 | Ruppi | |
| 7,241,492 B2 | 7/2007 | Kohara et al. | |
| 2002/0122701 A1 | 9/2002 | Ljungberg et al. | |
| 2002/0176755 A1 | 11/2002 | Ruppi | |
| 2003/0008181 A1 | 1/2003 | Ljungberg | |
| 2003/0143384 A1 * | 7/2003 | Ruppi et al. | 428/210 |
| 2004/0256442 A1 * | 12/2004 | Gates et al. | 228/141.1 |
| 2005/0013995 A1 * | 1/2005 | Ruppi | 428/336 |

FOREIGN PATENT DOCUMENTS

| | | |
|---|---|---|
| EP | 0 463 000 | 10/1994 |
| EP | 0 709 483 | 4/2002 |
| EP | 0 980 917 | 7/2002 |
| EP | 1 026 271 | 1/2003 |
| WO | 99/29920 | 6/1999 |
| WO | 99/29921 | 6/1999 |
| WO | 99/58753 | 11/1999 |
| WO | 00/52225 | 9/2000 |
| WO | 02/077312 | 10/2002 |

OTHER PUBLICATIONS

Written Opinion of the International Searching Authority, PCT/US 07/13773 filed on Jun. 22, 2007, mailed Nov. 29, 2007 (6 pages).

International Search Report for PCT/US 07/13773 filed on Jun. 22, 2007, mailed Nov. 29, 2007, (2 pages).

* cited by examiner

METHOD OF MAKING A CVD COATING SCHEME INCLUDING ALUMINA AND/OR TITANIUM-CONTAINING MATERIALS

CROSS-REFERENCE TO EARLIER FILED PATENT APPLICATION

This patent application is a divisional patent application of co-pending U.S. patent application Ser. No. 11/472,921, filed Jun. 22, 2006 and entitled CVD COATING SCHEME INCLUDING ALUMINA AND/OR TITANIUM-CONTAINING MATERIALS AND METHOD OF MAKING THE SAME. Applicants hereby claim the benefit of the earlier filing date of U.S. patent application Ser. No. 11/472,921, filed Jun. 22, 2006 under 35 USC §120 and 35 USC §121.

BACKGROUND OF THE INVENTION

The present invention pertains to a coating applied by chemical vapor deposition (CVD) and coated products, especially coated cutting inserts that are useful in material removal applications such as, for example, machining, turning, and milling. More specifically, the present invention pertains to a coated body, such as, for example, a coated cutting insert, wherein the coating scheme includes a coating layer of alumina and a titanium-containing material (e.g., titanium carbonitride and/or titanium aluminum oxycarbonitride) whereby the coating layer, which is applied by CVD, has acceptable adhesion and abrasive wear resistance, and methods of making the coating and the coated body.

Heretofore, coated bodies, such as, for example, coated cutting inserts, have been used in material removal applications. The coating layers typically comprise hard refractory materials that exhibit the property of wear resistance. One primary purpose of using a coating on a cutting insert has been to lengthen the useful life of the cutting insert. There have been coating schemes that include a coating layer of alumina and/or titanium carbonitride, and exemplary ones of these coating schemes are described in some of the following patent documents.

United States Published Patent Application No. US2003/0008181 A1 to Ljungberg pertains to a coated cutting tool that has an alumina coating with fine, equi-axed grains. U.S. Pat. No. 4,984,940 to Bryant et al. and European Patent No. 0 463 000 B1 each disclose using thin layers of a nitride of titanium, zirconium and/or hafnium to separate alumina layers wherein it includes a process of interrupting the deposition of a coating material. Published U.S. Patent Application No. US2002/0122701 A1 to Ljungberg et al. discloses that non-columnar alumina can be deposited via interrupting the deposition of the alumina.

U.S. Pat. No. 5,700,569 to Ruppi discloses a coating scheme comprising a plurality of alumina layers. If the alumina is kappa-alumina, there is a "modification layer" deposited on the surface of the underlaying alumina layer wherein the modification layer may comprise (AlTi)(O,C,N).

European Patent No. 0980917 B1 to Toshiba Tungaloy discloses a coating scheme that comprises TiN/Ti(C,N)/(Ti,Al)(C,N,O)+$Al_2O_3$/$Al_2O_3$/TiN. U.S. Pat. No. 5,545,490 to Oshika pertains to a coated cutting tool that includes a coating sequence that comprises TiN/TiCN/TiCNO/$Al_2O_3$. The TiCNO layer is a thin layer that separates the TiCN from the alumina layer. PCT Patent Application No. WO 99/58738 to Valenite, Inc. discloses a cemented carbide or ceramic article that presents a multi-layered CVD coating. In one embodiment, the coating comprises a layer of titanium carbonitride near the surface of the cemented carbide substrate, a multi-layered coating structure of alternating ultrathin layers of titanium carbonitride and alumina, and an outer layer of titanium nitride.

U.S. Pat. No. 4,714,660 to Gates, Jr. pertains to hard coatings on a cemented carbide substrate. The coating may comprise titanium-aluminum oxycarbonitride ($Ti_wAl_xO_yC_zN_u$) where w, x, y, z and u represent the mole fractions of Ti, Al, O, C and N, respectively. Published United States Patent Application No. US2002/0176755 A1 to Ruppi shows multiple alternating layers of MT-TiCN and alumina (Kappa phase and gamma phase). U.S. Pat. No. 6,333,099 B1 to Strondl et al. pertains to alternating coating sequences that contain alumina and what may be a titanium-aluminum carbide or nitride.

PCT Patent Application No. WO99/29920 to Sandvik AB and PCT Patent Application No. WO99/29921 each concern a periodic coating scheme in which alumina is one of the alternating coating layers. The other layer is a carbide or a nitride wherein the metals (M and L) can include Ti and Al. PCT Patent Application No. WO00/52225 to Kennametal for A TOOL HAVING A MULTILAYER COATING COMPRISING MULTIPLE MTCVD LAYERS discloses multiple layers of MTCVD-applied material separated by an interposed layer.

U.S. Pat. No. 5,700,551 to Kukino et al. discloses a modulated coating layer. FIG. 4 presents a periodic change in the coating composition. European Patent No. 0 709 483 B1 to Sumitomo Electric Industries pertains to a coating scheme that presents a compositionally modulated region. FIG. 17 depicts a modulated coating scheme.

U.S. Pat. No. 5,330,853 to Hofmann et al. pertains to a TiAlN coating scheme. The layers differ in the nitrogen content and a nitrogen gradient is shown through the thickness of a coating layer. U.S. Pat. No. 5,436,071 to Odani et al. and U.S. Pat. No. 5,920,760 to Yoshimura et al. disclose MT-CVD TiCN coatings. European Patent No. 1 026 271 B1 to Sandvik AB (Palmqvist et al. inventors) discloses cemented carbide (WC—Co plus additives) inserts that have the following coating sequence: TiN/MT-TiCN/$\alpha$-$Al_2O_3$/TiN. U.S. Pat. No. 4,028,142 to Bitzer et al. and U.S. Pat. No. 4,196,233 to Bitzer et al. disclose methods for making MTCVD coatings.

U.S. Pat. No. 5,164,051 to Komaki et al. relates to the pre-coating preparation of a substrate surface. These steps include electrolytically polishing the surface and scratching the surface. The substrate can be WC—Co and the coating is diamond. U.S. Pat. No. 5,380,408 to Svensson pertains to etching to remove cobalt from the surface of a substrate, as well as mechanical treatments such as blasting. U.S. Pat. No. 6,110,240 to Saguchi et al. discloses a pretreatment of the substrate prior to diamond coating. U.S. Pat. No. 5,648,119 to Grab et al. discloses (Col. 11, lines 55-58) buffing the diamond coated substrate.

As is apparent from the above documents, many different coating schemes for a coated cutting insert have been used in the past. According to these patent documents, each one of these coating schemes provides certain advantages. Even though there have been coating schemes that are supposed to provide certain advantages, there has always remained a desire to continue to lengthen the useful life, as well as to improve the performance characteristics, of the coated cutting inserts.

The desire to lengthen the useful life and improve the performance characteristics is especially the case for coated cutting inserts that use alumina and/or titanium carbonitride coating layers applied by CVD since these materials have good wear resistance properties. Alumina coating layers include refined grain alumina coating layers that exhibit excellent abrasion assistance. The same is true for titanium carbonitride coating layers including fine grain titanium carbonitride coating layers in that these coating layers exhibit excellent abrasion resistance. In the context of and for the purpose of this description and the claims, a refined grain microstructure is considered to exhibit an average grain size equal to or less than about one micrometer. However, one drawback with these coatings has been that when one deposits a thicker coating the grain structure becomes coarser as the thickness of the coating increases. A coarser grain structure typically reduces the abrasion resistance so that thicker coatings of alumina and/or titanium carbonitride have not provided for improved abrasion resistance.

Thus, it would be highly desirable to provide an improved coated cutting insert wherein the CVD coating comprises a coating scheme that includes a coating layer of alumina and a coating layer of titanium-containing material (e.g., titanium aluminum oxycarbonitride and/or titanium aluminum carbonitride) and the cutting insert is useful in material removal applications wherein the cutting insert has a lengthened tool life, as well as exhibits improved performance characteristics.

SUMMARY OF THE INVENTION

In one form thereof the invention is a method of making a coated body comprising the steps of: providing a substrate; applying by chemical vapor deposition a titanium carbonitride coating layer containing titanium carbonitride grains for a selected duration so as to terminate the growth of the titanium carbonitride grains at a pre-selected size and control the thickness of the titanium carbonitride coating layer so as to range between a lower limit equal to about 0.5 micrometers and an upper limit equal to about 25 micrometers; applying by chemical vapor deposition a first titanium/aluminum-containing coating layer containing first titanium/aluminum-containing grains for a selected duration so as to terminate the growth of the first titanium/aluminum-containing grains at a pre-selected size and control the thickness of the first titanium/aluminum-containing coating layer so as to range between a lower limit equal to greater than zero micrometers and an upper limit equal to about 5 micrometers, and wherein the first aluminum/titanium-containing coating layer is farther away from the substrate than the titanium carbonitride coating layer; and applying by chemical vapor deposition an alumina coating layer containing alumina grains for a selected duration so as to terminate the growth of the alumina grains at a pre-selected size and control the thickness of the alumina coating layer so as to range between a lower limit greater than zero micrometers and an upper limit equal to about 5 micrometers, and the alumina coating layer is farther away from the substrate than the first aluminum/titanium-containing coating layer. The first titanium-containing coating layer and the alumina coating layer comprises a coating sequence. The method comprises applying a plurality of sequences.

In yet another form thereof, the invention is a method of making a coated body comprising the steps of: providing a substrate; applying by chemical vapor deposition a base coating scheme to the substrate; applying by chemical vapor deposition a first sequential coating scheme comprising a first titanium-containing coating layer and a second aluminum-containing coating layer; and applying to the first sequential coating scheme by chemical vapor deposition a second sequential coating scheme comprising a third aluminum-containing coating layer and a fourth titanium-containing coating layer.

BRIEF DESCRIPTION OF THE DRAWINGS

The following is a brief description of the drawings that form a part of this patent application.

DETAILED DESCRIPTION OF THE INVENTION

Figure 1:
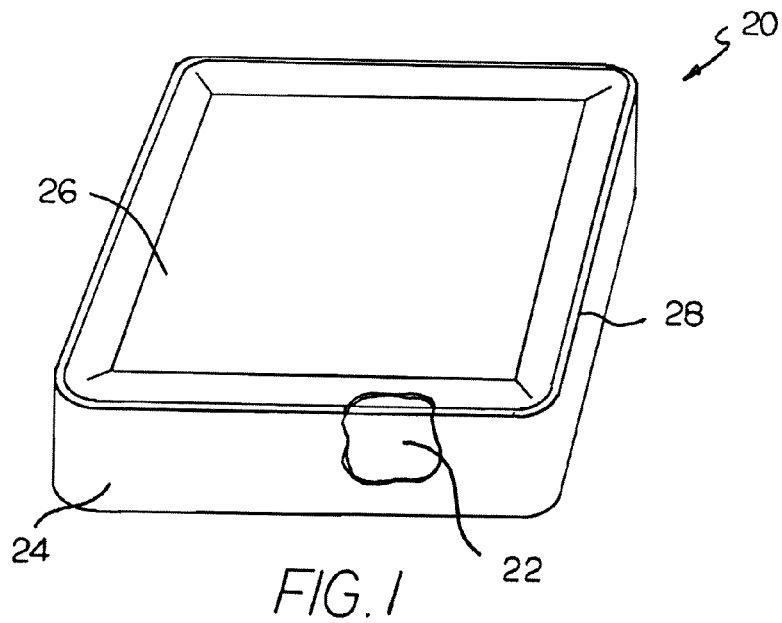
FIG. 1 is an isometric view of a coating cutting insert that has a coating scheme applied to a substrate wherein a portion of the coating scheme has been removed to show the substrate.
Figure 3:
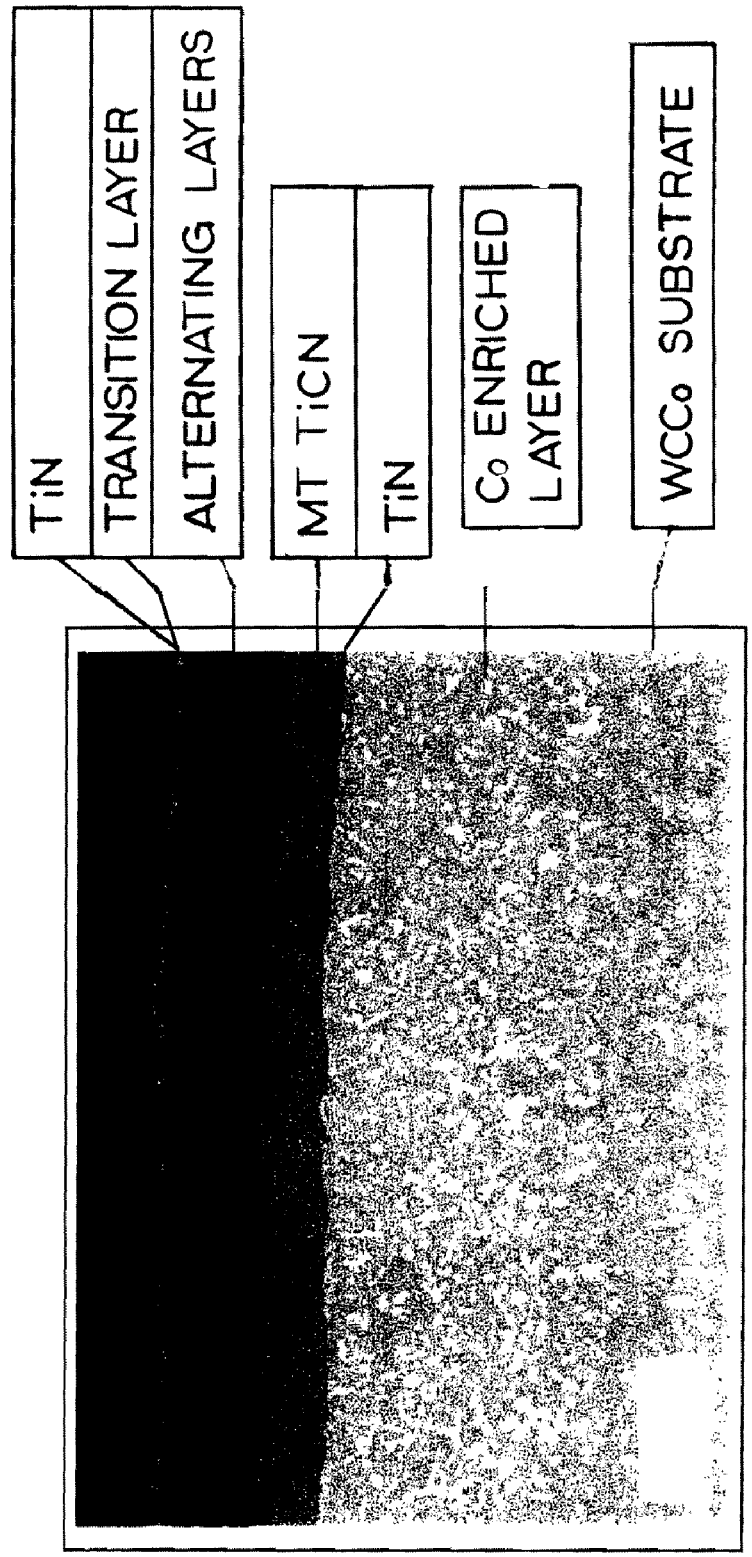
FIG. 3 is a colorized photomicrograph that includes a 10 micrometer scale and shows the cross-section of the coating scheme of Example No. 1.
Figure 4:
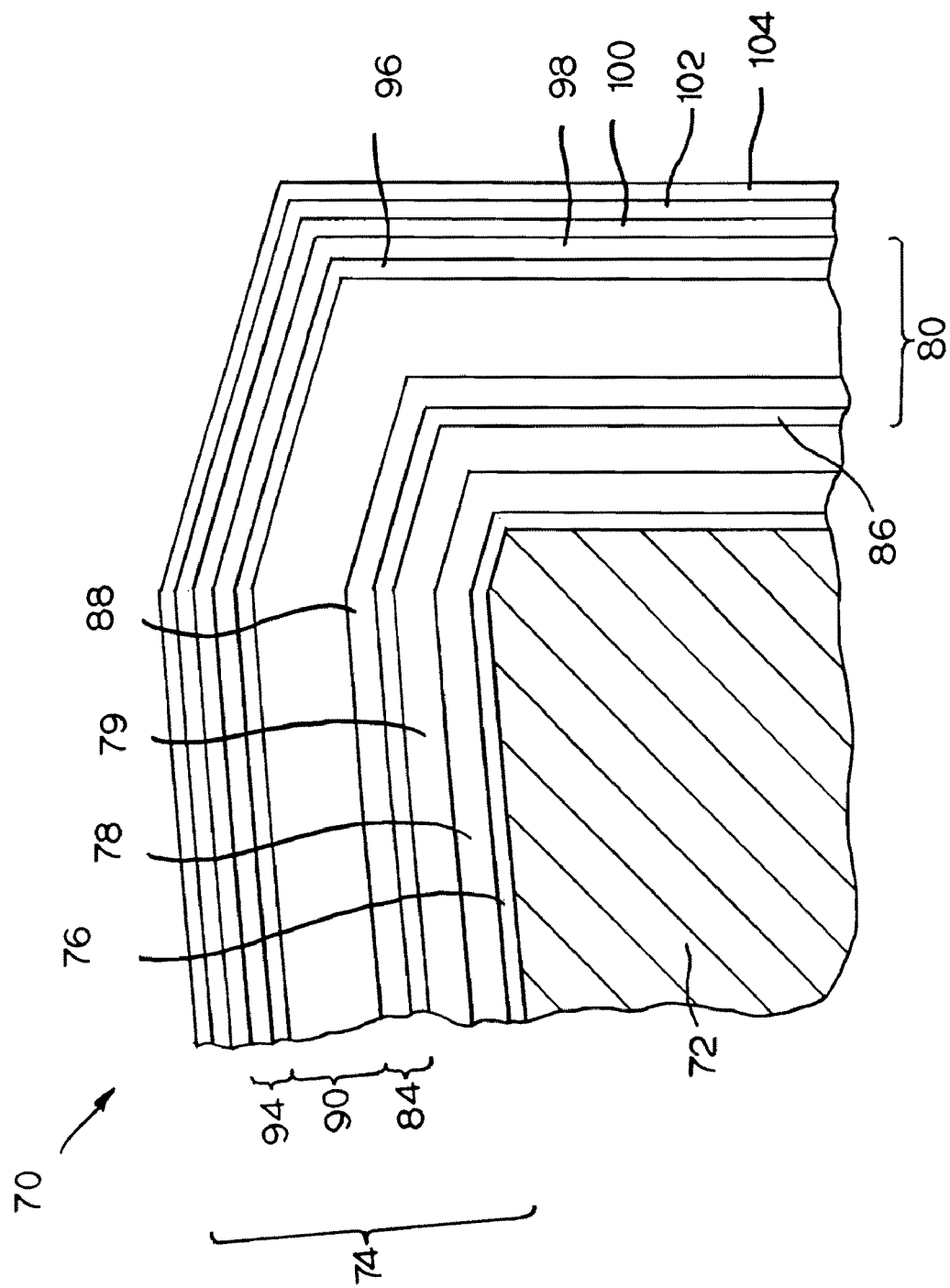
FIG. 4 is a cross-sectional view of a corner of a coated cutting insert that shows in schematic form the coating scheme of actual Example No. 2.
Figure 5:
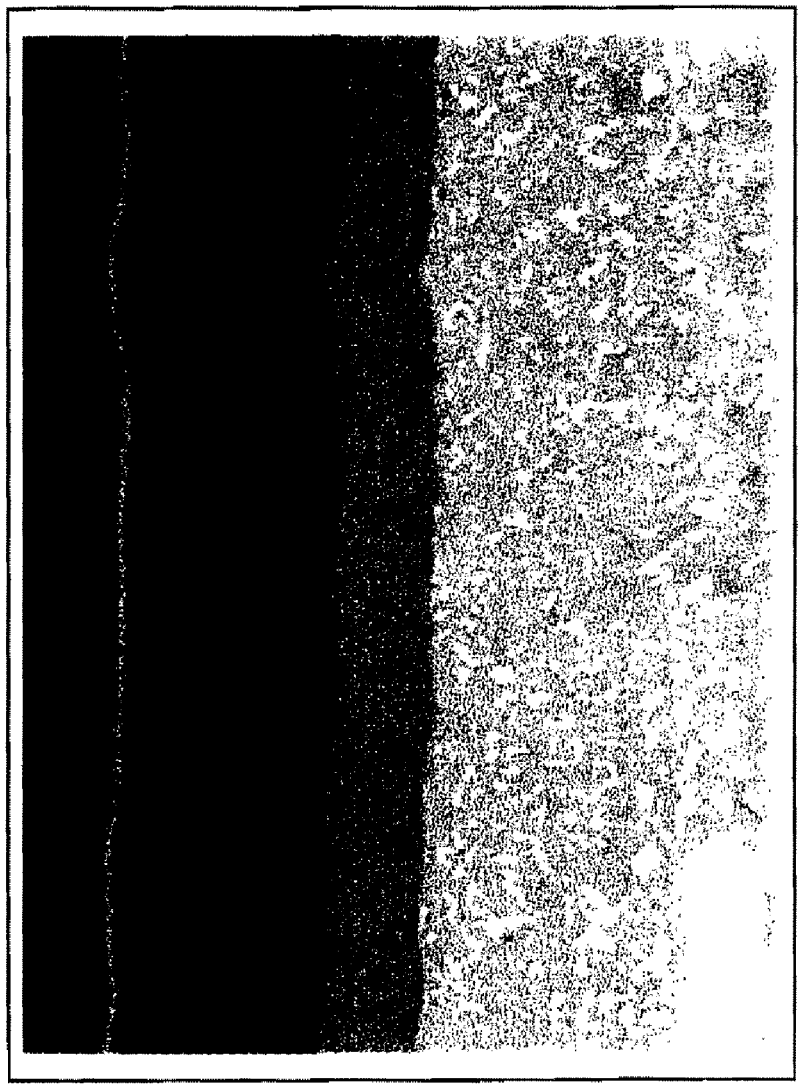
FIG. 5 is a colorized photomicrograph that includes a 10 micrometer scale and shows the cross-section of the coating scheme for actual Example No. 2.
Figure 6:
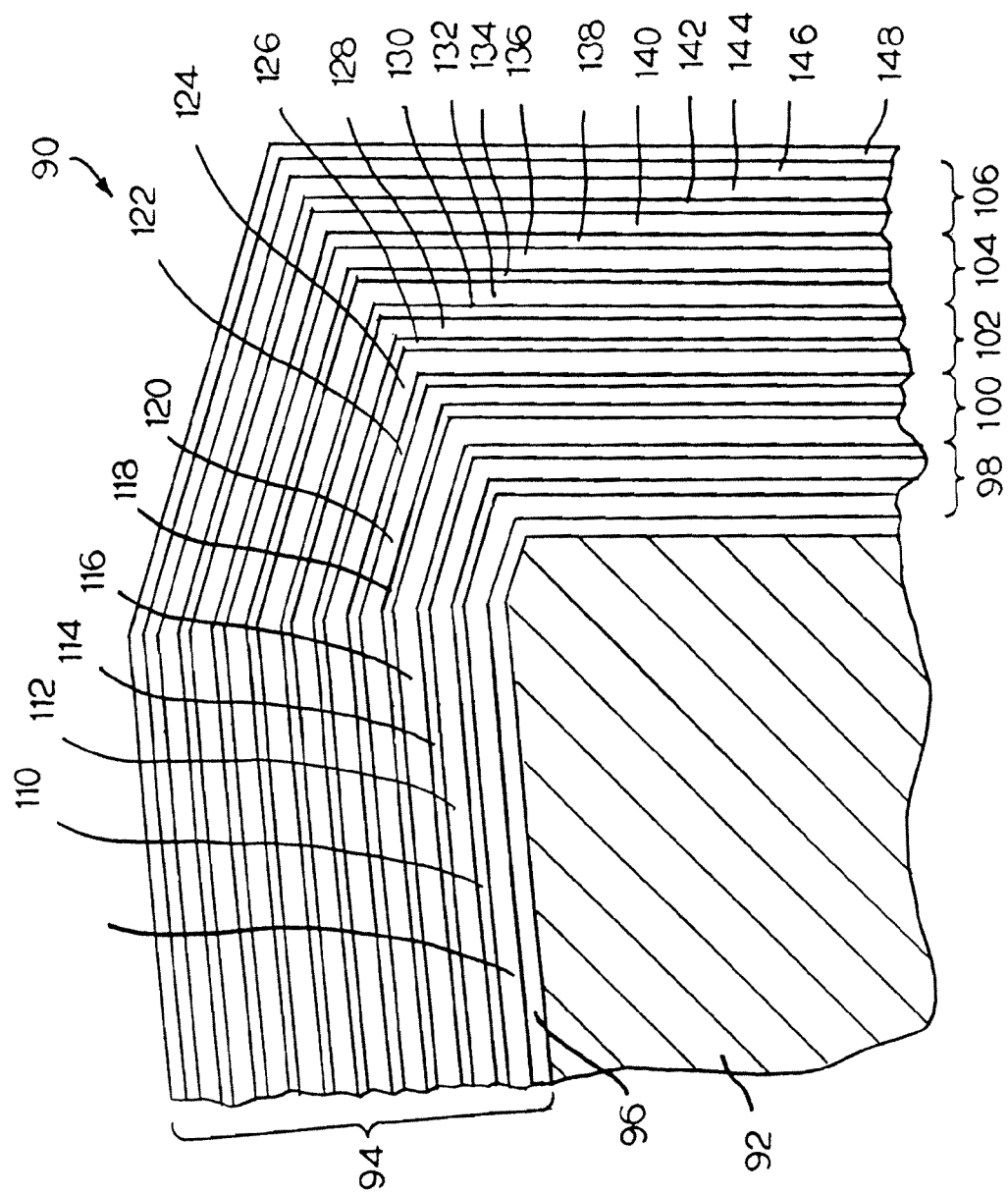
FIG. 6 is a cross-sectional view of a corner of a coated cutting insert that shows in schematic form a proposed embodiment of a coating scheme.
Figure 7:
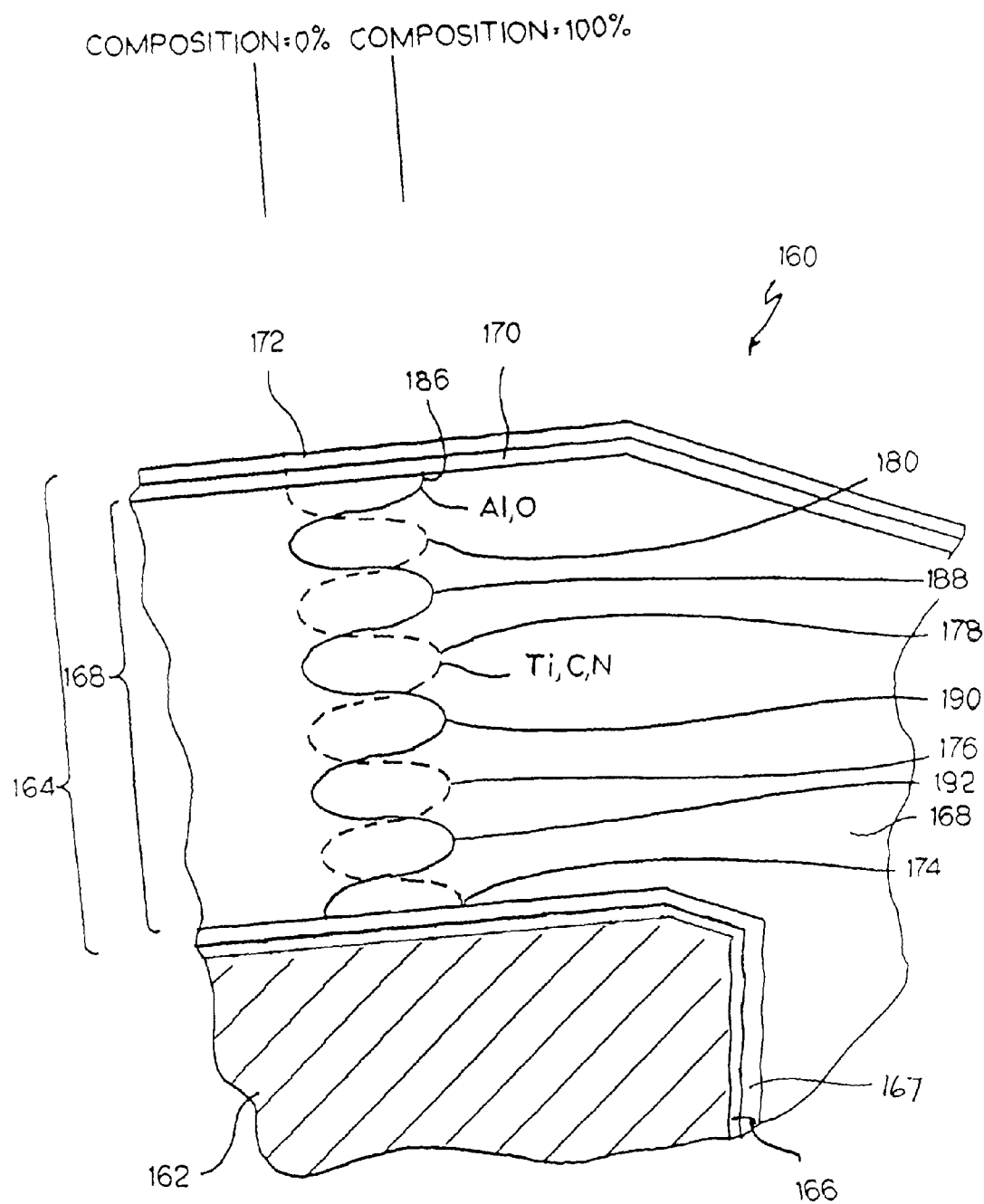
FIG. 7 is a cross-sectional view of a corner of a coated cutting insert that shows in schematic form another proposed embodiment of a coating scheme.
Figure 8:
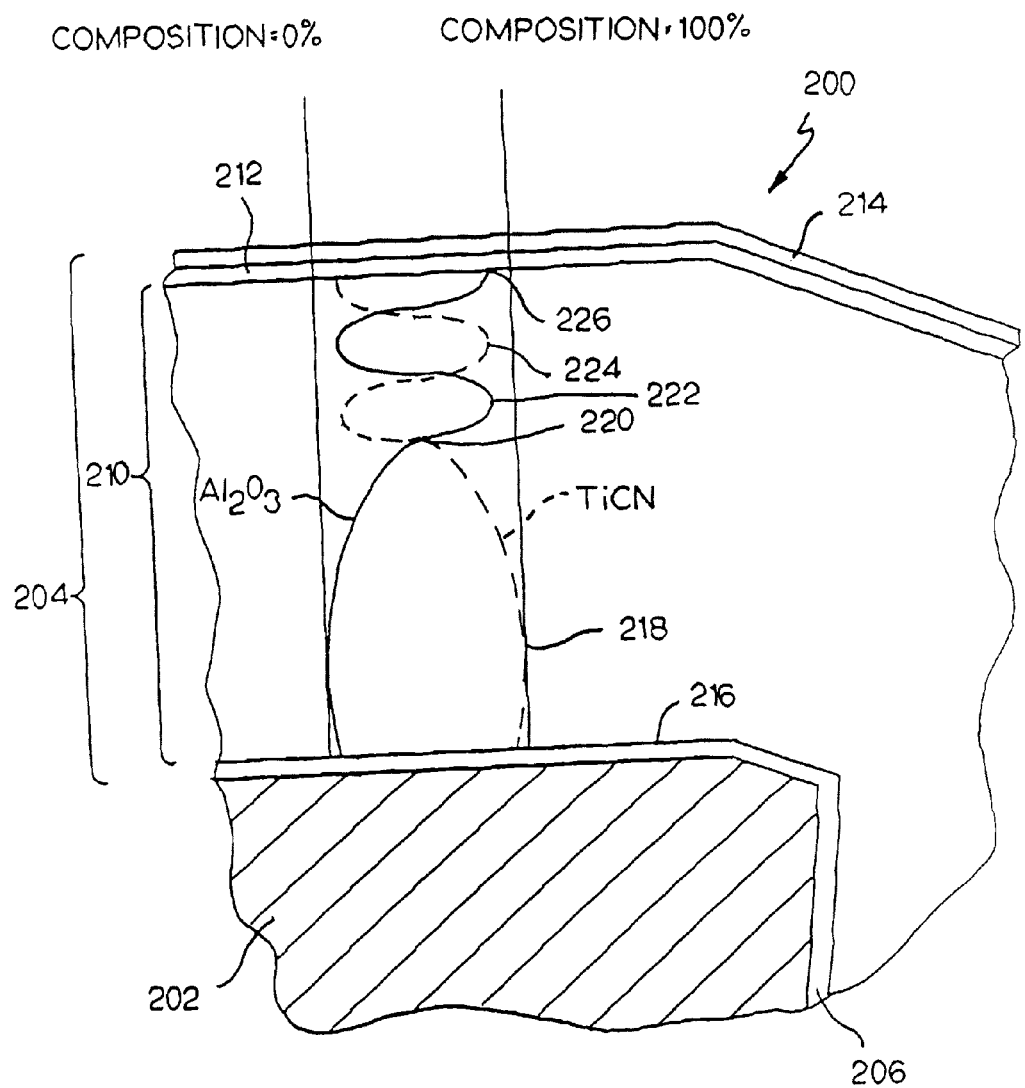
FIG. 8 is a cross-sectional view of a corner of a coated cutting insert that shows in schematic form still another proposed embodiment of a coating scheme.

Referring to the drawings, there are shown a number of specific embodiments of a coated cutting insert (the coated cutting insert is generally shown in FIG. 1) wherein each one of these specific embodiments is discussed in detail hereinafter. More specifically, FIGS. 2-3 pertain to the first specific embodiment that is an actual coating example, i.e., Example No. 1. FIGS. 4-5 pertain to a second specific embodiment that is an actual coating example, i.e., Example No. 2. FIG. 6 relates to a proposed third specific embodiment of a coating scheme. FIG. 7 relates to a proposed fourth specific embodiment of a coating scheme. FIG. 8 relates to a proposed fifth specific embodiment of a coating scheme.

The principal difference between each one of the specific embodiments rests in the coating scheme. The substrate for each one of the specific embodiments can be selected from the same group of materials. In this regard, suitable materials for the substrate include, but are not limited to, cemented carbides (e.g., tungsten carbide-cobalt materials), ceramics (e.g., silicon nitride-based ceramics, SiAlON-based ceramics, titanium carbonitride-based ceramics, titanium diboride-based ceramics, and alumina-based ceramics), cermets (e.g., cermets that have nickel-cobalt binder and a high level of titanium and could further include tungsten carbide and titanium carbide), and steels.

Applicants also contemplate that the substrate could exhibit gradient compositions, especially in the binder concentration, the carbonitride concentration and the carbide concentration. Exemplary substrates could include a cemented carbide substrate that presents a surface zone of binder enrichment or a cemented carbide substrate that exhibits a surface zone of binder depletion of solid solution carbide enrichment.

Other exemplary substrate materials are polycrystalline cubic boron nitride (PCBN) (exemplary PCBN materials include those with ceramic or metallic binder) and other superhard materials. The PCBN materials can be used in conjunction with cutting inserts in two basic ways. For one way, the PCBN inserts may be brazed to the cutting insert body. For the second way, the PCBN cutting inserts may be full top inserts.

For each one of the specific embodiments, one preferred substrate is polycrystalline cubic boron nitride (PcBN). Another preferred substrate material is based on cobalt cemented tungsten carbide that comprises between about 0.1 weight percent and about 20 weight percent cobalt and the balance tungsten carbide. It is possible that such a cobalt cemented tungsten carbide may include additives like titanium, tantalum, niobium, zirconium, hafnium, vanadium, and chromium either alone or in any combination wherein these additives may be in the form of carbides and/or nitrides and/or carbonitrides, as well as other additives typically added to cemented carbides.

For each one of the specific embodiments, it should be appreciated that prior to the deposition of the coating scheme the surface of the substrate may be treated so as to improve the adhesion of the coating scheme to the substrate. Exemplary pre-treatments include a process to remove or reduce the level of binder at the surface of the substrate. In the case of the cobalt cemented tungsten carbide substrate such a pre-treatment would remove cobalt from the surface of the substrate or treat the surface to improve the coating adhesion. Another exemplary pre-treatment would be a process that mechanically works the surface of the substrate so as to roughen the surface of the substrate making it ready to produce good coating adhesion.

It should be appreciated that in some instances the surface of the coating scheme may be subjected to a post-deposition treatment so as to improve performance and/or smoothness and/or adhesion. One exemplary treatment is the removal of asperities from the surface of the coating scheme so as to reduce or minimize any stress riser sites. Another exemplary treatment is to preferentially remove the coating (or a part of the coating layer) from selected areas of the cutting insert. A surface treatment typically reduces the tensile stresses or increases the compressive stresses in the coating layer(s). For example, PCT Patent Publication No. WO 02/077312 to Widia GmbH discloses shot blasting a coating (PVD or PCVD or CVD) to increase internal pressure stress or reduce internal tension stress in the outer coating layers.

Furthermore, it should be appreciated that to improve adhesion of the coating layers there may be provided microscopically rough interfaces between each of the coating layers. These microscopically rough interfaces can be generated by controlling the CVD (or moderate temperature chemical vapor deposition [MT-CVD]) parameters so as to promote high growth rates for the coating layers. High growth rates in CVD (including MT-CVD processes) processes may occur by the use of relatively high deposition temperatures and/or relatively high pressures. As another alternative to improve adhesion between coating layers, in the deposition process the composition can be gradually changed between adjacent layers so as to reduce the existence of a sharp compositional interface between adjacent coating layers.

In regard to the process to produce each one of the specific embodiments, it should be appreciated that for each one of the process steps, the pressure and the duration of the process step can vary so as to achieve the desired coating thickness. Generally speaking, the present process uses the concept of interrupting a coating step and then following up this interruption with another step that has a change (and sometimes a significant change) in coating composition or coating parameters. These interruptions result in coating layers in which the grains renucleate in each layer, and hence, exhibit a refined grain size (i.e., an average grain equal to or less than one micrometer).

For all of the actual examples; namely, Examples Nos. 1 and 2, the material in each coating layer displayed a refined grain size (i.e., a grain size equal to or less than one micrometer). There was interruption in the application of each one the coating layers, and this interruption resulted in the refined grain structure.

FIG. 1 illustrates an embodiment of a coated cutting insert (which is one form of a coated body) that is generally designated as 20. Coated cutting insert 20 comprises a substrate 22. A portion of the coating of coated cutting insert 20 is removed so as to show substrate 22 in FIG. 1. The substrate 22 can be made from any one of a number of acceptable substrate materials. Coated cutting insert 20 has a flank surface 24 and a rake surface 26. The flank surface 24 and the rake surface 26 intersect to form a cutting edge 28 at the juncture thereof. It should be appreciated that the coated cutting insert may exhibit geometries that are different from the geometry shown in FIG. 1. For example, although not illustrated, for certain cutting insert geometries, a coated cutting insert may contains a central aperture that is used to attach the coated cutting insert to a tool holder or the like.

Figure 2:
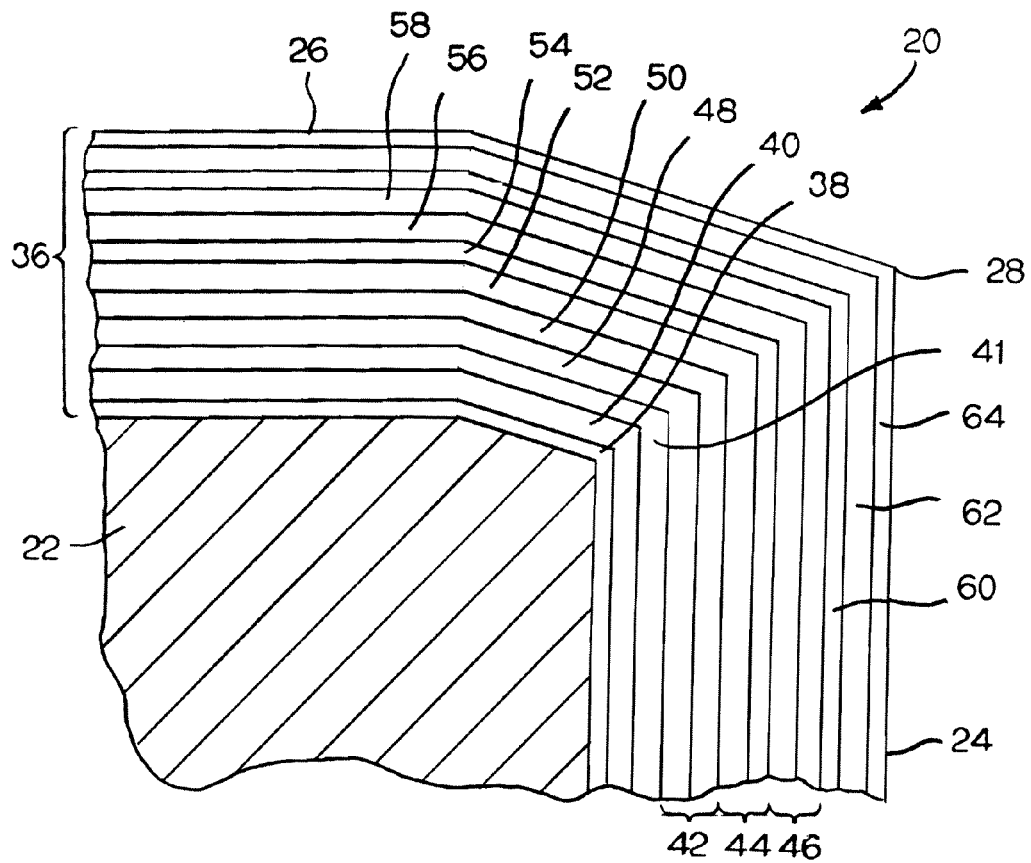
FIG. 2 is a cross-sectional view of a corner of a coated cutting insert that shows in schematic form the coating scheme of actual Example No. 1.

Referring to FIG. 2, there is shown in cross-section a first specific embodiment of a coating scheme (actual Example No. 1) at a corner of a coated cutting insert. The coating scheme of actual Example No. 1 is illustrated in schematic form in FIG. 2 and is generally designated by brackets as 36. As will be discussed later, FIG. 3 is a photomicrograph that shows in cross-section the actual coating scheme that is shown in schematic in FIG. 2.

Referring to coating scheme 36 and in particular to FIG. 2, the base or first coating layer (or base coating layer) 38 comprises titanium nitride applied by chemical vapor deposition (CVD) to the surface of substrate 22. This step is Step 1 in Table 1. For all of the coating layers of FIG. 2, the gases that were present at one time of another during the particular process step and the temperature of the particular process step are set forth in Table 1 hereinafter. The thickness of base coating layer 38 has a range that has a lower limit greater than zero micrometer and an upper limit equal to about 5 micrometers.

The second coating layer 40 is applied to the base coating layer 38 and comprises titanium carbonitride coating layer that contains titanium carbonitride grains applied by moderate temperature chemical vapor deposition (MT-CVD) at a temperature between 880° C. and 900° C. This step is Step 2 in Table 1. It should be appreciated that for the MT-CVD process steps, the deposition temperature can range between about 700 degrees Centigrade and about 920 degrees Centigrade. As an alternate range, the MT-CVD deposition temperature can range between about 850 degrees Centigrade and about 920 degrees Centigrade. As still another alternate range, the MT-CVD deposition temperature can range between about 870 degrees Centigrade and about 910 degrees Centigrade. The second coating layer 40 is applied for a selected duration so as to terminate the growth of the titanium carbonitride grains at a pre-selected grain size. The thickness of the second coating layer 40 has a range that has a lower limit equal to about 0.5 micrometers and an upper limit equal to about 25 micrometers. As an alternative, the thickness of the second coating layer 40 has a range that has a lower limit equal to about 1 micrometer and an upper limit equal to about 20 micrometers. It should be appreciated that the composition of the titanium carbonitride may vary through the thickness of the coating layer 40. In this regard, the carbon:nitrogen ratio (C:N) may change with the location in the coating layer 40. As one alternative, the titanium carbonitride may be carbon-rich at and near the bottom of the coating layer and may be nitrogen-rich at and near the top of the coating layer. It should also be appreciated that the titanium carbonitride coating layer applied by MT-CVD may instead be replaced by a titanium carbonitride coating layer applied by high temperature CVD.

A third coating layer 41 is applied to the second coating layer 40. The third coating layer 41 comprises a titanium carbonitride coating layer applied by high temperature chemical vapor deposition (HT-CVD) at a temperature equal to about 1000 degrees Centigrade. This step is Step 3 in Table 1. This coating layer of HT-CVD titanium carbonitride comprises titanium carbonitride grains and is applied for a selected duration so as to terminate the grains at a pre-selected grain size. The thickness of the coating layer 41 has a range between a lower limit equal to greater than zero micrometers and an upper limit equal to about 5 micrometers.

The next six coating layers actually comprise three repetitions of a pair of coating layers. Each one of the brackets 42, 44 and 46 designates a repetition of this trio of coating layers.

The first coating layer (48, 52, 56) in each repetition, which is formed via Step 4A in Table 1, comprises a titanium aluminum oxycarbonitride coating layer that comprises titanium aluminum oxycarbonitride grains applied by CVD. This first coating layer (48, 52, 56) is applied for a selected duration so as to terminate the grains that comprise the coating layer at a pre-selected average grain size. These first coating layers (48, 52, 56) can be considered titanium/aluminum-containing coating layers that comprise titanium/aluminum-containing grains. The thickness of each one of these first coating layers (48.52, 56) has a range that has a lower limit greater than zero micrometers and an upper limit equal to about 5 micrometers. As an alternative, the thickness of each coating layer (48, 52, 56) has a lower limit equal to about 0.1 micrometers and an upper limit equal to about 4 micrometers.

The second coating layer (50, 54, 58) in each one of the repetitions, which is formed via Step 4B in Table 1, is applied by CVD and comprises an alumina coating layer that comprises alumina grains. The alumina coating layer is applied for a selected duration so as to terminate the alumina grain at a pre-selected average grain size. The thickness of each alumina coating layer (50, 54, 58) has a range that has a lower limit equal to about 0.5 micrometers and an upper limit equal to about 25 micrometers. As an alternative, the thickness of each coating layer (50, 54, 58) has a lower limit equal to about 1 micrometer and an upper limit equal to about 20 micrometers.

The next coating layer 60 is applied by CVD to the alumina layer 58 and comprises a titanium aluminum carbonitride coating layer (i.e., titanium-containing coating layer) that comprises titanium alumina carbonitride grains applied by CVD for a selected duration so as to terminate the growth of the titanium aluminum carbonitride grains at a pre-selected average grain size. This step is Step 5 in Table 1. The thickness of coating layer 60 has a range that has a lower limit equal to greater than zero micrometers and an upper limit equal to about 5 micrometers. As an alternative, the thickness of coating layer 60 has a lower limit equal to about 0.1 micrometer and an upper limit equal to about 4 micrometers.

The next coating layer 62 comprises titanium carbonitride applied by chemical vapor deposition to the coating layer 60. This step is Step 6 in Table 1. The thickness of this coating layer 62 ranges between about 0.5 micrometers and about 2 micrometers.

The outer coating layer 64 comprises titanium nitride applied by chemical vapor deposition to the coating layer 62. This step is Step 7 in Table 1. The thickness of this outer coating layer 64 ranges a lower limit equal to about 0.1 micrometers and an upper limit equal to about 5 micrometers.

As mentioned above, FIG. 3 is a photomicrograph that shows the microstructure in cross-section of actual Example No. 1. More specifically, the base layer is a titanium nitride coating layer that is goldish in color and is thin. The next layer is titanium carbonitride that was applied by moderate temperature chemical vapor deposition (MT-CVD) and it has a blue/gray color. The next layer is titanium carbonitride deposited via a high temperature chemical vapor deposition (HT-CVD) process and it is blue/gray in color.

After completion of the application of the HT-CVD layer of titanium carbonitride, there are three coating sequences wherein each coating sequence comprises: (a) a titanium/aluminum-containing coating layer (i.e., the titanium aluminum oxycarbonitride coating layer), and (b) an alumina coating layer. The HT-CVD titanium carbonitride coating layer is a blue-gray color and is thin. The titanium aluminum oxycarbonitride layer is goldish in color and is thin. The alumina coating layer is black and (at least in this embodiment) is thicker than the other coating layer. There is a titanium aluminum carbonitride coating layer and a titanium carbonitride layer that transitions from the coating sequence to the outer layer of titanium nitride. These transition coating layers are pinkish in color. The outer titanium nitride layer is yellowish (or goldish) in color.

In regard to the process to produce the coating scheme of Example No. 1, Table 1 discloses these processing steps. Referring to Table 1, the process steps are listed in the first column beginning on the left side of Table 1. It should be appreciated that Steps 4A through 4B comprise the steps to apply the coating layers that comprise each coating sequence. The second column sets forth the temperature range in degrees Centigrade for the corresponding process step. The third column sets forth the pressure range in millibars for the corresponding process step. The fourth column sets forth the total duration in minutes of the corresponding process step. The fifth column sets forth the gases that were present (in whole or in part) during the corresponding process step.

TABLE 1

Process Steps to Produce the First Specific Embodiment of the Coating Scheme

| Step/Parameter | Temperature (° C.) Range | Pressure (mb) Range | Total Time (minutes) of the step) | Gases Present |
|---|---|---|---|---|
| Step 1 Base Layer 38 of Titanium Nitride | 900-905 | 70-160 | 35 | $H_2 + N_2 + TiCl_4$ |
| Step 2 MT-CVD titanium carbonitride Coating Layer 40 | 880-900 | 70-90 | 417 | $H_2 + N_2 + TiCl_4 + CH_3CN$ |
| Step 3 HT-CVD titanium carbonitride Coating Layer 40 | 1000 | 500 | 16 | $H_2 + CH_4 + N_2 + TiCl_4$ |

TABLE 1-continued

Process Steps to Produce the First Specific Embodiment of the Coating Scheme

| Step/Parameter | Temperature (° C.) Range | Pressure (mb) Range | Total Time (minutes) of the step) | Gases Present |
|---|---|---|---|---|
| Start Repetitions | | | | |
| Step 4A: titanium aluminum oxycarbonitride Coating Layer (48, 52, 56) | 1000 | 75-500 | 41 | $H_2 + CH_4 + N_2 + TiCl_4 + AlCl_3 + HCl + CO + CO_2$ |
| Step 4B Alumina Coating Layer (50, 54, 58) | 1000 | 75 | 140 | $H_2 + N_2 + AlCl_3 + HCl + CO + CO_2 + H_2S$ |
| End Repetitions | | | | |
| Step 5: titanium alumina carbonitride Coating Layer | 1000 | 80-500 | 30 | $H_2 + CH_4 + N_2 + TiCl_4 + AlCl_3$ |
| Step 6: titanium carbonitride Coating Layer | 985 | 200-500 | 66 | $H_2 + CH_4 + N_2 + TiCl_4$ |
| Step 7: titanium nitride | 980 | 200-800 | 121 | $H_2 + N_2 + TiCl_4$ |

For ease of understanding Step 4A in Table 1 is listed as a single step; however, in actuality, Step 4A comprises the following three sequential steps each performed at 1000° C. and within the pressure range of 75-500 mb: Step 4A-1 lasts for a duration equal to 30 minutes and uses the following gases $H_2$, $CH_4$, $N_2$, $TiCl_4$, CO, this is followed by Step 4A-2 that lasts for 5 minutes and uses the following gases $H_2$, $CH_4$, $N_2$, $TiCl_4$, CO and $AlCl_3$), and finally, this is followed by Step 4A-3 that lasts for 6 minutes and uses the following gases: $H_2$, $CH_4$, $N_2$, $TiCl_4$, CO, $CO_2$ and HCl. Applicants believe that Step 4A-1 deposits a layer of titanium oxycarbonitride, and that Step 4A-2 deposits a layer of titanium aluminum oxycarbonitride, and that Step 4A-3 deposits a layer of titanium oxide that functions as an alpha-alumina nucleation coating layer. It should be appreciated that applicants believe that the coating layers deposited via Step 4A exhibits a whisker morphology and the coating layers of Steps 4A-2 and 4A-3 coat the whiskers. Applicants do not intend to limit the invention to the presence of these coating layers of titanium oxycarbonitride or titanium aluminum oxycarbonitride or titanium oxide.

For ease of understanding, Step 4B in Table 1 is listed as a single step, but in actuality, it comprises the following three sequential steps each performed at a temperature equal to 1000° C. and a pressure equal to 75 mb: Step 4B-1 has a duration equal to 30 minutes and uses the following gases: $H_2+N_2+AlCl_3+HCl+CO+CO_2$, this step is then followed by Step 4B-2 which lasts for 100 minutes and uses the following gases: $H_2+AlCl_3+HCl+CO_2+H_2S$, and finally, this step is followed by Step 4B-3 which lasts for 10 minutes and uses the following gases: $H_2+N_2+AlCl_3+HCl+CO_2$. Each one of Steps 4B-1 through 4B-3 deposits a layer of alumina.

For ease of understanding, Step 5 in Table 1 is listed as a single step, however, in actuality, it comprises the following two sequential steps which occur at 1000 degrees Centigrade: Step 5-1 lasts for 10 minutes at a pressure equal to 80 mb and uses the following gases: $H_2+CH_4+N_2+TiCl_4+AlCl_3$. Step 5-2 lasts for 20 minutes at a pressure equal to 500 mb and uses the following gases: $H_2+CH_4+N_2+TiCl_4+AlCl_3$. Step 5-1 and Step 5-2 each deposit a layer of titanium aluminum carbonitride.

Referring to FIG. 4, there is shown in cross-section a corner of a second embodiment of a coated cutting insert (which is one form of the coated body) generally designated as 70. Coated cutting insert 70 comprises a substrate 72. Coated cutting insert 70 has a coating scheme shown by brackets 74. Coating scheme 74 comprises coating layers applied by CVD or MT-CVD that are described hereinafter. The temperature ranges and the gases present (in whole or for a part of the deposition step) for each layer are set out in Table 2 hereinafter.

The first or base coating layer 76 comprises a titanium nitride coating layer that contains titanium nitride grains and is deposited on the surface of the substrate 72 by CVD. This is Step 1 in Table 2. The thickness of the first coating layer 76 has a lower limit greater than zero micrometers and an upper limit equal to about 5 micrometers. The titanium nitride grains have an average grain size equal to or less than about one micrometer.

The second coating layer 78 comprises a titanium carbonitride coating layer that contains titanium carbonitride grains applied by MT-CVD to the base coating layer 76. This is Step 2 in Table 2. The second coating layer 78 is applied for a selected duration so as to terminate the growth of the titanium carbonitride grains at a pre-selected grain size. The titanium carbonitride grains have an average grain size equal to or less than about one micrometer. The thickness of the second coating layer 78 has a lower limit equal to about 0.5 micrometers and an upper limit equal to about 25 micrometers. The third coating layer 79 comprises titanium carbonitride applied via HT-CVD. This is Step 3 in Table 2. The thickness of the third coating layer 79 ranges between greater than 0 micrometers to about 5 micrometers, and more preferably, ranges between about 0.1 micrometers and about 4 micrometers.

The coating scheme 74 further includes eighteen coating sequences shown by bracket 80 wherein each coating sequence 80 comprises a pair of coating layers. One coating layer of the pair is a coating layer of titanium aluminum oxycarbonitride deposited by CVD, and this is Step 4A in Table 2. The other coating layer is a coating layer of alumina deposited by CVD, and this is Step 4B in Table 2. Each titanium aluminum oxycarbonitride coating layer comprises titanium carbonitride grains. Each titanium aluminum oxycarbonitride layer is applied by CVD for a selected duration so as to terminate the growth of the titanium aluminum oxycarbonitride grains at a pre-selected grain size. The titanium aluminum oxycarbonitride grains have an average grain size equal to or less than one micrometer. Each alumina coating layer comprises alumina grains. Each alumina layer is applied by CVD for a selected duration so as to terminate the growth of the alumina grains at a pre-selected grain size. The alumina grains have an average grain size equal to or less than one micrometer.

More specifically, the bottom coating sequence is shown by bracket 84 and comprises the coating layer of titanium aluminum oxycarbonitride 86 and the coating layer of alumina 88. Bracket 90 is representative of the middle sixteen coating sequences wherein each coating sequence is like coating sequence 84. The top coating sequence is shown by bracket 94 and comprises a coating layer of titanium aluminum oxycarbonitride 96 and a coating layer of alumina 98.

The total thickness of each one of the coating sequences (84, 94) ranges between a lower limit equal to about 0.1 micrometers and an upper limit equal to about 10 micrometers. As an alternative, the total thickness of each one of these coating sequence (84, 94) ranges between a lower limit equal to about 1 micrometer and an upper limit equal to about 8 micrometers. The thickness of the titanium aluminum oxycarbonitride coating layer (86, 96) that is part of each one of these coating sequences (84, 94) ranges between a lower limit greater than zero micrometers and an upper limit equal to about 5 micrometers. As an alternative, the thickness of this titanium aluminum oxycarbonitride coating layer (86, 96) ranges between a lower limit equal to about 0.1 micrometers and an upper limit equal to about 4 micrometers. The thickness of the alumina coating layer (88, 98) that is a part of each one of these coating sequences (84, 94) ranges between a lower limit equal to about 0.1 micrometers and an upper limit equal to about 25 micrometers. As an alternative, the thickness of this alumina coating layer (88, 98) ranges between a lower limit equal to about 1 micrometers and an upper limit equal to about 20 micrometers.

In this specific coating scheme 74, the next coating layer is a layer of titanium aluminum carbonitride 100, which is Step 5 in Table 2. Coating layer 100 is followed by a layer of titanium carbonitride 102, which is Step 6 in Table 2. Coating layer 102 is followed by the outer layer of titanium nitride 104, which is Step 7 in Table 2. The thickness of the titanium aluminum carbonitride coating layer 100 ranges between a lower limit equal to greater than zero micrometers and an upper limit equal to about 5 micrometers. As an alternative, the thickness of the this coating layer 100 ranges between a lower limit equal to about 0.1 micrometers and an upper limit equal to about 4 micrometers. The thickness of the titanium carbonitride coating layer 102 ranges between a lower limit equal to about 0.1 micrometers and an upper limit equal to about 5 micrometers. The thickness of the outer titanium nitride coating layer 104 ranges between a lower limit equal to about 0.1 micrometers and an upper limit equal to about 5 micrometers.

The titanium aluminum carbonitride coating layer comprises titanium aluminum carbonitride grains that have an average grain size equal to or less than about one micrometer. The titanium aluminum carbonitride coating layer is applied for a selected duration so as to terminate the growth of the titanium aluminum carbonitride grains at a pre-selected grain size.

The titanium carbonitride coating layer comprises titanium carbonitride grains that have an average grain size equal to or less than about one micrometer. The titanium carbonitride coating layer is applied for a selected duration so as to terminate the growth of the titanium carbonitride grains at a pre-selected grain size.

The titanium nitride coating layer comprises titanium nitride grains that have an average grain size equal to or less than about one micrometer. The titanium nitride coating layer is applied for a selected duration so as to terminate the growth of the titanium nitride grains at a pre-selected grain size.

In regard to the process to produce the second specific embodiment of the invention, Table 2 discloses the processing steps used to produce the coating scheme of the second specific embodiment (actual Example No. 2) of the coating cutting insert. Referring to Table 2, the first column beginning on the left side of Table 2 sets forth the process steps. It should be appreciated that Steps 4A through 4B comprise the steps that apply the coating layers that comprise each coating sequence.

The second column sets forth the temperature range in degrees Centigrade for the corresponding step. The third column sets forth the pressure range in millibars for the corresponding step. The fourth column sets forth the total duration in minutes of the corresponding step. The fifth column sets forth the gases that were present (in whole or in part) during the corresponding step.

TABLE 2

Process Steps to Produce the Second Specific Embodiment of the Coating Scheme

| Step/Parameter | Temperature (° C.) Range | Pressure (mb) Range | Total Time (minutes) of the step | Gases Present |
|---|---|---|---|---|
| Step 1: Base Layer 76 of Titanium Nitride | 900-905 | 70-160 | 35 | $H_2 + N_2 + TiCl_4$ |
| Step 2: MT titanium carbonitride Coating Layer | 880-900 | 70-90 | 417 | $H_2 + CH_3CN + N_2 + TiCl_4$ |
| Step 3: HT titanium carbonitride coating layer Begin Each Repetition | 1000 | 500 | 17 | $H_2 + CH_4 + N_2 + TiCl_4$ |
| Sequence Step 4A: titanium aluminum oxycarbonitride Coating Layers | 1000 | 75-500 | 41 | $H_2 + CH_4 + N_2 + TiCl_4 + AlCl_3 + HCl + CO + CO_2$ |
| Sequence Step 4B: Alumina Coating Layers End Each Repetition | 1000 | 75 | 30 | $H_2 + N_2 + AlCl_3 + HCl + CO + CO_2 + H_2S$ |
| Step 5: titanium aluminum carbonitride Coating Layer | 1000 | 80-500 | 30 | $H_2 + CH_4 + N_2 + TiCl_4 + AlCl_3$ |
| Step 6: titanium carbonitride coating layer | 985 | 200-500 | 66 | $H_2 + CH_4 + N_2 + TiCl_4$ |
| Step 7: titanium nitride Outer Coating Layer | 980-985 | 200-800 | 121 | $H_2 + N_2 + TiCl_4$ |

For ease of understanding Step 4A in Table 2 is listed as a single step; however, in actuality, Step 4A comprises the following three sequential steps each performed at 1000° C. and within the pressure range of 75-500 mb: Step 4A-1 lasts for a duration equal to 30 minutes and uses the following gases $H_2$, $CH_4$, $N_2$, $TiCl_4$, CO, this is followed by Step 4A-2 that lasts for 5 minutes and uses the following gases $H_2$, $CH_4$, $N_2$, $TiCl_4$, CO and $AlCl_3$), and finally, this is followed by Step 4A-3 that lasts for 6 minutes and uses the following gases: $H_2$, $CH_4$, $N_2$, $TiCl_4$, CO, $CO_2$ and HCl. Applicants believe that Step 4A-1 deposits a layer of titanium oxycarbonitride, and that Step 4A-2 deposits a layer of titanium aluminum oxycarbonitride, and that Step 4A-3 deposits a layer of titanium oxide that functions as an alpha-alumina nucleation coating layer. It should be appreciated that applicants believe that the coating layers deposited via Step 4A exhibits a whisker morphology wherein the coating layer of Step 4A-1 has a whisker morphology and the coating layers of Steps 4A-2 and 4A-3 coat the whiskers. Applicants do not intend to limit the invention to the presence of these coating layers of titanium oxycarbonitride or titanium aluminum oxycarbonitride or titanium oxide.

For ease of understanding, Step 4B in Table 1 is listed as a single step, but in actuality, it comprises the following three sequential steps each performed at a temperature equal to 1000° C. and a pressure equal to 75 mb: Step 4B-1 has a duration equal to 5 minutes and uses the following gases: $H_2+N_2+AlCl_3+HCl+CO+CO_2$, this step is then followed by Step 4B-2 which lasts for 20 minutes and uses the following gases: $H_2+AlCl_3+HCl+CO_2+H_2S$, and finally, this step is followed by Step 4B-3 which lasts for 5 minutes and uses the following gases: $H_2+N_2+AlCl_3+HCl+CO_2$. Each one of Steps 4B-1 through 4B-3 deposits a layer of alumina.

For ease of understanding, Step 5 in Table 2 is listed as a single step; however, in actuality, it comprises the following two sequential steps which occur at 1000 degrees Centigrade: Step 5-1 lasts for 10 minutes at a pressure equal to 80 mb and uses the following gases: $H_2+CH_4+N_2+TiCl_4+AlCl_3$ Step 5-2 lasts for 20 minutes at a pressure equal to 500 mb and uses the following gases: $H_2+CH_4+N_2+TiCl_4+AlCl_3$. Step 5-1 and Step 5-2 each deposit a layer of titanium aluminum carbonitride.

FIG. 5 is a photomicrograph (in color) that shows the microstructure of an actual coating scheme that is shown in schematic form in FIG. 4 as coating scheme 74. The particular substrate shown in FIG. 5 is a tungsten carbide-cobalt cemented carbide.

Referring to the coating scheme shown in FIG. 5, the base layer is a titanium nitride coating layer that is goldish in color and is thin. The next layer is titanium carbonitride that was applied by moderate temperature chemical vapor deposition (MT-CVD) and it has a blue/gray color. The next layer is titanium carbonitride that was applied by high temperature chemical vapor deposition (HT-CVD) and it also has a blue/gray color.

After completion of the application of the HT-CVD layer of titanium carbonitride, there are eighteen coating sequences wherein each one of the coating sequences comprises: (a) a titanium/aluminum-containing coating layer (i.e., the titanium aluminum oxycarbonitride coating layer), and (b) an alumina coating layer. The titanium aluminum oxycarbonitride layer is goldish in color and is thin. The alumina coating layer is black and thicker. There is a titanium aluminum carbonitride layer and a titanium carbonitride layer that transition from the coating sequence to the outer layer of titanium nitride. These transition layers are pinkish in color. The outer titanium nitride layer is yellowish (or goldish) in color.

Referring to FIG. 6, there is shown in cross-section a corner of a proposed third embodiment of a coated cutting insert (which is exemplary of a coated body) generally designated as 90. Coated cutting insert 90 comprises a substrate 92. The coated cutting insert 90 has a coating scheme shown by brackets 94. Coating scheme 94 comprises a plurality of coating layers that are described hereinafter.

The base (or first) coating layer 96 is titanium nitride (that comprises titanium nitride grains) deposited by CVD on the surface of the substrate 92. The process parameters for the application of base layer 96 are along the lines of those set out in Table 1 for the application of layer 38. The CVD process is for a selected duration so as to terminate the growth of the titanium nitride grains at a pre-selected grain size. The titanium nitride grains have an average grain size equal to or less than about one micrometer. The first coating layer 96 has a thickness that can range between a lower limit equal to greater than zero micrometers and an upper limit equal to about 5 micrometers.

The coating scheme 94 further includes a series of five coating sequences as shown by brackets 98, 100, 102, 104, 106. The thickness of each one of these coating sequences (98, 100, 102, 104, 106) ranges between a lower limit equal to about 0.1 micrometers and an upper limit equal to about 25 micrometers. As an alternative, the thickness of each coating sequence (98, 100, 102, 104, 106) ranges between a lower limit equal to about 1 micrometer and an upper limit equal to about 20 micrometers.

Each one of these coating sequences (98, 100, 102, 104, 106) comprises four coating layers. The first coating layer in each coating sequence comprises a coating layer of titanium carbonitride that comprises titanium carbonitride grains applied by CVD. The CVD process is applied for a selected duration so as to terminate the growth of the titanium carbonitride grains at a pre-selected grain size. The titanium carbonitride grains have an average grain size equal to or less than about one micrometer. A portion of this coating layer of titanium carbonitride is applied by MT-CVD wherein the deposition temperature of the MT-CVD process ranges between about 700 degrees Centigrade and about 900 degrees Centigrade. The deposition of the balance of the titanium carbonitride coating layer in the sequence is deposited at a temperature of about 1000 degrees Centigrade. Exemplary process parameters for this coating layer (MT-CVD and HT-CVD) of titanium carbonitride are set out in Table 1 as Steps 2A and 2B.

The second coating layer in each coating sequence comprises a coating layer of titanium aluminum oxycarbonitride that comprise titanium aluminum oxycarbonitride grains deposited by CVD wherein this coating layer has a thickness that ranges between a lower limit greater than zero micrometers and an upper limit equal to about 5 micrometers. As an alternative, the thickness of this coating layer of titanium aluminum oxycarbonitride ranges between a lower limit equal to about 0.1 micrometers and an upper limit equal to about 4 micrometers. Exemplary process parameters for this coating layer of titanium aluminum oxycarbonitride are set out in Step 4A of Table 1. The CVD process is applied for a selected duration so as to terminate the growth of the titanium aluminum oxycarbonitride grains at a pre-selected grain size. The titanium aluminum oxycarbonitride grains have an average grain size equal to or less than about one micrometer.

The third coating layer in each coating sequence comprises a coating layer of alumina deposited by CVD wherein this coating layer has a thickness that ranges between a lower limit equal to about 0.1 micrometers and an upper limit equal to about 25 micrometers. As an alternative, the thickness of this coating layer of refined grain alumina ranges between a lower limit equal to about 1 micrometer and an upper limit equal to about 20 micrometers. Exemplary process parameters for this coating layer of alumina are set out in Step 4B of Table 1. The CVD process is applied for a selected duration so as to terminate the growth of the alumina grains at a pre-selected grain size. The alumina grains have an average grain size equal to or less about one micrometer. The crystalline phase for this alumina coating layer is alpha phase.

The fourth coating layer in each coating sequence comprises a coating layer of titanium aluminum oxycarbonitride deposited by CVD wherein this coating layer has a thickness that ranges between a lower limit equal to greater than zero micrometers and an upper limit equal to about 5 micrometers. As an alternative, the thickness of this coating layer of titanium aluminum oxycarbonitride ranges between a lower limit equal to about 0.1 micrometers and an upper limit equal to about 4 micrometers. Exemplary process parameters for this coating layer of titanium aluminum oxycarbonitride are set out in Step 4A of Table 1. The CVD process is applied for a selected duration so as to terminate the growth of the titanium aluminum oxycarbonitride grains at a pre-selected grain size. The titanium aluminum oxycarbonitride grains have an average grain size equal to or less about one micrometer.

Referring in more detail to these five coating sequences (98, 100, 102, 104, 106), the first of these coating sequences 98 comprises a second coating layer 108 of titanium carbonitride, a third coating layer 110 of titanium aluminum oxycarbonitride, a fourth coating layer 112 alumina, and a fifth coating layer 114 of titanium aluminum oxycarbonitride. The second one of these coating sequences 100 comprises a sixth coating layer 116 of titanium carbonitride, a seventh coating layer 118 of titanium aluminum oxycarbonitride, an eighth coating layer 120 alumina, and a ninth coating layer 122 of refined grain titanium aluminum oxycarbonitride.

The third one of the coating sequences 102 comprises a tenth coating layer 124 of titanium carbonitride, an eleventh coating layer 126 of titanium aluminum oxycarbonitride, a twelfth coating layer 128 of alumina, and a thirteenth coating layer 130 of titanium aluminum oxycarbonitride. The fourth one of the coating sequences 104 comprises a fourteenth coating layer 132 of titanium carbonitride, a fifteenth coating layer 134 of titanium aluminum oxycarbonitride, a sixteenth coating layer 136 alumina, and a seventeenth coating layer 138 of titanium aluminum oxycarbonitride.

The fifth coating sequence 106 comprises an eighteenth coating layer 140 of titanium carbonitride, a nineteenth coating layer 142 of titanium aluminum oxycarbonitride, a twentieth coating layer 144 of alumina, and a coating layer 146 of titanium aluminum oxycarbonitride.

The coating scheme finally has an outer titanium nitride coating layer 148 wherein this coating layer 148 has a thickness that ranges between a lower limit equal to about 0.1 micrometers and an upper limit equal to about 5 micrometers. Titanium nitride coating layer 148 comprises titanium nitride grains. This coating layer is applied for a selected duration so as to terminate the growth of the titanium nitride grains at a pre-selected grain size. The titanium nitride grains have an average grain size equal to or less than about one micrometer.

Referring to FIG. 7, there is shown in cross-section a corner of a fourth specific embodiment of a coated cutting insert generally designated as 160. Coated cutting insert 160 includes a substrate 162. The process parameters for the steps to deposit coating scheme 164 are set out in Table 3 hereinafter.

The coating scheme shown by brackets 164 includes a base coating layer 166 that comprises titanium nitride applied by CVD. This is Step 1 in Table 3. The temperature ranges at which the coating layer 166 is deposited may range and the gases present are the same as those for the base coating layer 38 of the first specific embodiment. Base coating layer 166 has a thickness that ranges between a lower limit equal to about 0.1 micrometers and an upper limit equal to about 5 micrometers.

Step 2 in Table 3 occurs at a temperature equal to between 880-900° C. at a pressure equal to 70-90 mb and for a duration equal to 182 minutes. The gases presents are set forth in connection with Step 2 in Table 3. Step 2 of Table 3 deposits a layer of titanium carbonitride 167 (see FIG. 7).

The coating scheme 164 further includes an intermediate coating region shown by brackets 168 applied by CVD. This is Step 3 in Table 3. Intermediate coating region 168 comprises a modulated composition comprising two basic mixtures of components. One of the component mixtures comprises aluminum and oxygen. The other of the component mixtures comprises titanium, carbon and nitrogen.

The coating scheme 164 further includes a coating layer 170 of refined grain titanium aluminum oxycarbonitride applied by CVD to the intermediate coating region 168. This is Step 4 in Table 3. The temperature ranges at which the coating layer 170 is deposited and the gases present are the same as those for the coating layer 40 of the first specific embodiment. The layer 170 of refined grain titanium aluminum oxycarbonitride has a thickness that ranges between a lower limit equal to about 0.1 micrometers and an upper limit equal to about 5 micrometers.

The coating scheme 164 finally includes an outer coating layer 172 of refined titanium nitride deposited by CVD to the coating layer 170. The temperature ranges at which the coating layer 172 is deposited and the gases present are the same as those for the outer coating layer 64 of the first specific embodiment. The outer coating layer 172 has a thickness that ranges between a lower limit equal to about 0.1 micrometers and an upper limit equal to about 4 micrometers.

Referring back to the intermediate coating region 168, one of the sinusoidal curves is solid and represents the mixture of aluminum and oxygen. The other one of the sinusoidal curves is broken (or dashed) and represents the mixture of titanium, carbon and nitrogen. As shown by the sinusoidal curves for these two components, the composition of the intermediate coating region 168 comprises only titanium, carbon and nitrogen beginning at the interface (designated as 174) with the base coating layer 166 of titanium nitride and at periodic points (176, 178, 180) throughout the thickness of the intermediate coating region 168. As also shown by the sinusoidal curves for these two components, the composition of the intermediate coating region 168 comprises only aluminum and oxygen (i.e., alumina) at the interface (designated as 186) with the coating layer 170 (titanium aluminum oxycarbonitride) and at periodic points (188, 190, 192) throughout the thickness of the intermediate coating region 168.

As also shown by the sinusoidal curves for these two components, the composition of the intermediate coating region 168, except for those points in which the composition is either only aluminum and oxygen or only titanium, nitrogen and carbon, contains titanium, aluminum, oxygen, carbon and nitrogen so as to form titanium aluminum oxycarbonitride of varying compositions. The concentrations of each one of the elements varies throughout the thickness of the intermediate coating region 168 as is apparent from and is in accordance with the sinusoidal curves for the two components.

It should be appreciated that the variation of the elements may take on a shape different from that of a sinusoidal curve. In fact, applicants contemplate that any periodic curve (i.e., repeatable shape) would be suitable. Applicants do not intend to limit the scope of the invention by the shape of any particular geometry that represents the variation of the elements.

In regard to a process that could be used to produce the fourth specific embodiment of the invention, Table 3 discloses the processing steps that could be used to produce the coating scheme of the fourth specific embodiment of the coating cutting insert. Referring to Table 3, the first column beginning on the left side of Table 3 sets out the process steps. The second column sets forth the temperature range in degrees Centigrade for the corresponding step. The third column sets forth the pressure range in millibars for the corresponding step. The fourth column sets forth the total duration in minutes of the corresponding step. The fifth column sets forth the gases that were present (in whole or in part) during the corresponding step.

TABLE 3

Process Steps that Could be Used to Produce the
Fourth Specific Embodiment of the Coating Scheme

| Step/Parameter | Temperature (° C.) Range | Pressure (mb) Range | Total Time (minutes) of the step) | Gases Present |
|---|---|---|---|---|
| Step 1: Base Layer of Titanium Nitride | 900-905 | 70-160 | 35 | $H_2 + N_2 + TiCl_4$ |
| Step 2 Layer of Titanium Carbonitride | 880-900 | 70-90 | 182 | $H_2 + N_2 + TiCl_4 + CH_3CN$ |
| Step 3 Modulating Coating Region | | | | |
| Step 4: Coating Layer 170 of titanium carbonitride | 1000 | 200-500 | 66 | $H_2 + CH4 + N2 + TiCl_4$ |
| Step 5: Outer Coating Layer 172 of titanium nitride | 980-985 | 200-800 | 121 | $H_2 + N2 + TiCl_4$ |

The coating sequence for Step 3 is set forth in Table 3A below. For all of the steps, the pressure was equal to 75 mb, and the temperature was equal to 880° C.

TABLE 3A

Coating Sequence for Step 3 (Modulating Coating Region)

| Step | Material | Duration | Gases Present |
|---|---|---|---|
| Step 3-1 | MT-titanium carbonitride | Steps 3-1 and 3-2 equal 30 minutes | $H_2 + N_2 + TiCl_4 + CH_3CN$ |
| Step 3-2 | Alumina | | $H_2 + HCl + CO_2 + H_2S + AlCl_3$ |
| Step 3-3 | Alumina | Steps 3-3 and 3-4 equal 30 minutes | $H_2 + HCl + CO_2 + H_2S + AlCl_3$ |
| Step 3-4 | MT-titanium carbonitride | | $H_2 + N_2 + TiCl_4 + CH_3CN$ |
| Step 3-5 | MT-titanium carbonitride | Steps 3-5 and 3-6 equal 30 minutes | $H_2 + N_2 + TiCl_4 + CH_3CN$ |
| Step 3-6 | Alumina | | $H_2 + HCl + CO_2 + H_2S + AlCl_3$ |
| Step 3-7 | Alumina | Steps 3-7 and 3-8 equal 30 minutes | $H_2 + HCl + CO_2 + H_2S + AlCl_3$ |
| Step 3-8 | MT-titanium carbonitride | | $H_2 + N_2 + TiCl_4 + CH_3CN$ |
| Step 3-9 | MT-titanium carbonitride | Steps 3-9 and 3-10 equal 30 minutes | $H_2 + N_2 + TiCl_4 + CH_3CN$ |
| Step 3-10 | Alumina | | $H_2 + HCl + CO_2 + H_2S + AlCl_3$ |

As an alternative, a coating scheme could be like that set forth in Table 3, except that the modulating coating region would be performed at a temperature equal to 1000° C., and would follow the sequence set forth in Table 3B below.

TABLE 3B

Coating Sequence for Step 3 (Modulating Coating Region)

| Step | Material | Pressure (mb) | Duration | Gases Present |
|---|---|---|---|---|
| Step 3-1 | MT-titanium carbonitride | 500 mb for 15 minutes | Steps 3-1 and 3-2 equal 30 minutes | $H_2 + N_2 + TiCl_4 + CH_3CN$ |
| Step 3-2 | Alumina | 75 mb for 15 minutes | | $H_2 + HCl + CO_2 + H_2S + AlCl_3$ |
| Step 3-3 | Alumina | 75 mb for 15 minutes | Steps 3-3 and 3-4 equal 30 minutes | $H_2 + HCl + CO_2 + H_2S + AlCl_3$ |
| Step 3-4 | MT-titanium carbonitride | 500 mb for 15 minutes | | $H_2 + N_2 + TiCl_4 + CH_3CN$ |
| Step 3-5 | MT-titanium carbonitride | 500 mb for 15 minutes | Steps 3-5 and 3-6 equal 30 minutes | $H_2 + N_2 + TiCl_4 + CH_3CN$ |
| Step 3-6 | Alumina | 75 mb for 15 minutes | | $H_2 + HCl + CO_2 + H_2S + AlCl_3$ |
| Step 3-7 | Alumina | 75 mb for 15 minutes | Steps 3-7 and 3-8 equal 30 minutes | $H_2 + HCl + CO_2 + H_2S + AlCl_3$ |
| Step 3-8 | MT-titanium carbonitride | 500 mb for 15 minutes | | $H_2 + N_2 + TiCl_4 + CH_3CN$ |
| Step 3-9 | MT-titanium carbonitride | 500 mb for 15 minutes | Steps 3-9 and 3-10 equal 30 minutes | $H_2 + N_2 + TiCl_4 + CH_3CN$ |
| Step 3-10 | Alumina | 75 mb for 15 minutes | | $H_2 + HCl + CO_2 + H_2S + AlCl_3$ |

Referring to both alternatives as set forth in Tables 3A and 3B, the combination of Steps 3-1 and 3-2 can be considered to be a first sequential coating scheme. This first sequential coating scheme comprises a first titanium-containing coating layer (which corresponds to the coating layer applied by Step 3-1) and a second aluminum-containing coating layer (which corresponds to the coating layer applied by Step 3-2). The combination of Steps 3-3 and 3-4 can be considered to be a second sequential coating scheme. This second sequential coating scheme comprises a third aluminum-containing coating layer (which corresponds to the coating layer applied by Step 3-3) and a fourth titanium-containing coating layer (which corresponds to the coating layer applied by Step 3-4).

Still referring to both alternatives as set forth in Tables 3A and 3B, the combination of Steps 3-5 and 3-6 can be considered to be a third sequential coating scheme. This third sequential coating scheme comprises a fifth titanium-containing coating layer (which corresponds to the coating layer applied by Step 3-5) and a sixth aluminum-containing coating layer (which corresponds to the coating layer applied by Step 3-6). The combination of Steps 3-7 and 3-8 can be considered to be a fourth sequential coating scheme. This fourth sequential coating scheme comprises a seventh aluminum-containing coating layer (which corresponds to the coating layer applied by Step 3-7) and an eighth titanium-containing coating layer (which corresponds to the coating layer applied by Step 3-8).

Still referring to both alternatives as set forth in Tables 3A and 3B, the combination of Steps 3-9 and 3-10 can be considered to be a fifth sequential coating scheme. This fifth sequential coating scheme comprises a ninth titanium-containing coating layer (which corresponds to the coating layer applied by Step 3-9) and a tenth aluminum-containing coating layer (which corresponds to the coating layer applied by Step 3-10). It should be appreciated that applicants contemplate that more than five sequential coating schemes may be applied to a substrate.

It should be appreciated that the inventors contemplate that other hard coating materials may be within the scope of the present invention. In this regard, the hard materials may include refined grain carbides, nitrides, carbonitrides and oxycarbonitrides of the Group IVB metals, as well as, alumina (including alpha-alumina, gamma-alumina and kappa-alumina), zirconium oxide and hafnium oxide and combinations thereof.

Referring to FIG. 8, there is shown in cross-section a corner of a fourth specific embodiment of a coated cutting insert generally designated as 200. Coated cutting insert 200 includes a substrate 202. The process parameters for the steps to deposit coating scheme 204 are set out in Table 3 hereinafter.

The coating scheme shown by brackets 204 includes a base coating layer 206 that comprises refined grain titanium nitride applied by CVD. The temperature ranges at which the coating layer 206 is deposited may range and the gases present are the same as those for the base coating layer 38 of the first specific embodiment. Base coating layer 206 has a thickness that ranges between greater than 0 micrometers and about 5 micrometers.

The coating scheme 204 further includes an intermediate coating region shown by brackets 210 applied by CVD. Intermediate coating region 210 comprises a modulated composition comprising two basic mixtures of components. One of the component mixtures comprises aluminum and oxygen. The other of the component mixtures comprises titanium, carbon and nitrogen.

The coating scheme 204 further includes a coating layer 212 of refined grain titanium aluminum oxycarbonitride applied by CVD to the intermediate coating region 210. The temperature ranges at which the coating layer 212 is deposited and the gases present are the same as those for the coating layer 42 of the first specific embodiment. The layer 212 of refined grain titanium aluminum oxycarbonitride has a thickness that ranges between about 0.5 micrometers and about 2 micrometers.

The coating scheme 204 finally includes an outer coating layer 214 of refined titanium nitride deposited by CVD to the coating layer 212. The temperature ranges at which the coating layer 214 is deposited and the gases present are the same as those for the outer coating layer 48 of the first specific embodiment. The outer coating layer 214 has a thickness that ranges between about 0.1 micrometers and about 5 micrometers.

Referring back to the intermediate coating region 210, one of the curves is solid and represents a mixture of aluminum and oxygen. The other one of the curves is broken (or dashed) and represents a mixture of titanium, carbon and nitrogen. As shown by the curves for these two components, the composition of the intermediate coating region 210 comprises primarily titanium, carbon and nitrogen (with a minority of aluminum and oxygen) beginning at the interface (designated as 216) with the base coating layer 206 of titanium nitride. The composition of the intermediate coating region 210 gradually changes as the coating region 210 moves away from the interface 216 to a point 218 at which the composition is only titanium, carbon and nitrogen.

The composition of the intermediate coating region 210 again changes as the coating region 210 moves still further away from the interface 216 (i.e., a movement from point 218 to point 220.) The change is of a nature such that the aluminum-oxygen content increases and the titanium-carbon-nitrogen content decreases so that at point 220 the amount of aluminum and oxygen is about equal to the amount of titanium and nitrogen and carbon.

The composition of the coating region 210 changes according to a sinusoidal curve from point 220 to an interface with the coating layer 212. More specifically, the composition varies so that at point 222 and point 226 the coating has a composition that has a majority component of aluminum and oxygen and a minority component of titanium, carbon and nitrogen. At point 224, the coating has a composition that has a majority component of titanium, carbon, and nitrogen and a minority component of aluminum and oxygen. Point 226 is the interface between the coating region 210 and the coating layer 212.

Except for that point 218 in which the composition is only titanium, nitrogen and carbon, the coating contains titanium, aluminum, oxygen, carbon and nitrogen so as to form titanium aluminum oxycarbonitride of varying compositions. The concentrations of each one of the elements varies throughout the thickness of the intermediate coating region.

It should be appreciated that the inventors contemplate that other hard coating materials may be within the scope of the present invention. In this regard, the hard materials may include refined grain carbides, nitrides, carbonitrides and oxycarbonitrides of the Group IVB metals, as well as, alumina (including alpha-alumina, gamma-alumina, and kappa-alumina), zirconium oxide, and hafnium oxide.

The patents and other documents identified herein are hereby incorporated by reference herein. Other embodiments of the invention will be apparent to those skilled in the art from a consideration of the specification or a practice of the invention disclosed herein. It is intended that the specification and examples are illustrative only and are not intended to be limiting on the scope of the invention. The true scope and spirit of the invention is indicated by the following claims.

What is claimed is:

1. A method of making a coated body comprising the steps of:

providing a substrate;

applying by chemical vapor deposition a titanium carbonitride coating layer containing titanium carbonitride grains for a selected duration so as to terminate the growth of the titanium carbonitride grains at a pre-selected size and control the thickness of the titanium carbonitride coating layer so as to range between a lower limit equal to about 0.5 micrometers and an upper limit equal to about 25 micrometers;

applying by chemical vapor deposition a first titanium/aluminum-containing coating layer containing first titanium/aluminum-containing grains for a selected duration so as to terminate the growth of the first titanium/aluminum-containing grains at a pre-selected size and control the thickness of the first titanium/aluminum-containing coating layer so as to range between a lower limit equal to greater than zero micrometers and an upper limit equal to about 5 micrometers, the first titanium/aluminum-containing coating layer exhibiting a whisker morphology, and wherein the first titanium/aluminum-containing coating layer is farther from the substrate than the titanium carbonitride coating layer;

applying by chemical vapor deposition an alumina coating layer containing alumina grains for a selected duration so as to terminate the growth of the alumina grains at a pre-selected size and control the thickness of the alumina coating layer so as to range between a lower limit greater than zero micrometers and an upper limit equal to about 5 micrometers, and the alumina coating layer being farther away from the substrate than the first aluminum/titanium-containing coating layer, and wherein the first titanium/aluminum containing coating layer and the alumina coating layer comprising a coating sequence, and the method comprises applying a plurality of the coating sequences by CVD.

2. The method of claim 1 wherein the coating scheme further including depositing by chemical vapor deposition a second titanium/aluminum-containing coating layer containing second titanium/aluminum-containing grains for a selected duration so as to terminate the growth of the second titanium/aluminum-containing grains to a pre-selected size, and the second titanium/aluminum-containing grains further containing one or more of oxygen and carbon and nitrogen, and the second aluminum/titanium-containing coating layer being farther away from the substrate than the alumina coating layer.

3. The method of claim 2 wherein the titanium carbonitride grains in the titanium carbonitride coating layer having an average grain size equal to or less than about one micrometer, and first titanium/aluminum-containing grains in the first titanium/aluminum-containing coating layer having an average grain size equal to or less than about one micrometer, the alumina grains in the alumina coating layer having an average grain size equal to or less than about one micrometer, and the second titanium/aluminum-containing grains in the second titanium/aluminum-containing coating layer having an average grain size equal to or less than about one micrometer.

4. A method of making a coated body comprising the steps of:
providing a substrate;
applying by chemical vapor deposition a base coating scheme to the substrate;
applying by chemical vapor deposition a first sequential coating scheme consisting of a first titanium-containing coating layer and a second aluminum-containing coating layer wherein the second aluminum-containing coating layer is applied directly to the first titanium-containing coating layer;
applying to the first sequential coating scheme by chemical vapor deposition a second sequential coating scheme consisting of a third aluminum-containing coating layer and a fourth titanium-containing coating layer wherein the third aluminum-containing coating layer is directly applied to the second aluminum-containing coating layer and the fourth titanium-containing coating layer is directly applied to the third aluminum-containing coating layer;
applying to the second sequential coating scheme by chemical vapor deposition a third sequential coating scheme consisting of a fifth titanium-containing coating layer and a sixth aluminum-containing coating layer wherein the fifth titanium-containing coating layer is directly applied to the fourth titanium-containing coating layer and the sixth aluminum-containing coating layer is directly applied to the fifth titanium-containing coating layer; and
applying to the third sequential coating scheme by chemical vapor deposition a fourth sequential coating scheme consisting of a seventh aluminum-containing coating layer and an eighth titanium-containing coating layer wherein the seventh aluminum-containing coating layer is directly applied to the sixth aluminum-containing coating layer and the eighth titanium-containing coating layer is directly applied to the seventh aluminum-containing coating layer.

5. The method of claim 4 wherein the titanium-containing coating layer comprises titanium carbonitride, and the aluminum-containing coating layer comprises aluminum oxide.

6. The method of claim 4 wherein the first sequential coating layer and the second sequential coating layer being applied at a substantially same temperature and pressure and duration.

7. The method of claim 4 wherein the titanium-containing coating layer of the first sequential coating scheme and the second sequential coating scheme being applied at a first pressure and the aluminum-containing coating layer of the first sequential coating scheme and the second sequential coating scheme being applied at a second pressure, and the first pressure being greater than the second pressure.

8. The method of claim 7 wherein the first pressure being at least about four times greater than the second pressure.

9. The method of claim 4 further comprising:
applying to the fourth sequential coating scheme by chemical vapor deposition a fifth sequential coating scheme consisting of a ninth titanium-containing coating layer and a tenth aluminum-containing coating layer wherein the ninth titanium-containing coating layer is directly applied to the eighth titanium-containing coating layer and the tenth aluminum-containing coating layer is directly applied to the ninth titanium-containing coating layer.

* * * * *

UNITED STATES PATENT AND TRADEMARK OFFICE
CERTIFICATE OF CORRECTION

PATENT NO.        : 8,221,838 B2
APPLICATION NO.   : 12/137633
DATED             : July 17, 2012
INVENTOR(S)       : Alfred S. Gates, Jr. et al.

It is certified that error appears in the above-identified patent and that said Letters Patent is hereby corrected as shown below:

ON THE TITLE PAGE

In Item (57), under "ABSTRACT", in Column 2, Line 8,
delete "between a" and insert -- between --, therefor.

IN THE SPECIFICATION

In Column 7, Line 39, delete "(48.52, 56)" and insert -- (48, 52, 56) --, therefor.

Signed and Sealed this
Twenty-third Day of April, 2013

Teresa Stanek Rea
*Acting Director of the United States Patent and Trademark Office*